United States Patent
McAdams

(10) Patent No.: US 7,079,408 B2
(45) Date of Patent: Jul. 18, 2006

(54) CIRCUIT AND METHOD FOR REDUCING FATIGUE IN FERROELECTRIC MEMORIES

(75) Inventor: Hugh McAdams, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 209 days.

(21) Appl. No.: 10/644,239

(22) Filed: Aug. 19, 2003

(65) Prior Publication Data

US 2005/0041452 A1    Feb. 24, 2005

(51) Int. Cl.
*G11C 27/00* (2006.01)
*G11C 11/22* (2006.01)

(52) U.S. Cl. .................... 365/49; 365/145; 365/185.08
(58) Field of Classification Search ................. 365/49, 365/145, 149, 185.09, 200, 185.08
See application file for complete search history.

(56) References Cited

U.S. PATENT DOCUMENTS

| | | | | |
|---|---|---|---|---|
| 4,221,003 A | * | 9/1980 | Chang et al. ................. 365/49 |
| 5,930,161 A | * | 7/1999 | Sheikholeslami et al. ...... 365/49 |
| 6,006,313 A | * | 12/1999 | Fukumoto ................... 365/200 |
| 6,041,389 A | * | 3/2000 | Rao ........................... 365/200 |
| 6,205,047 B1 | * | 3/2001 | Ogino ........................ 365/200 |
| 6,236,602 B1 | * | 5/2001 | Patti ............................ 365/49 |
| 6,400,602 B1 | * | 6/2002 | Takata et al. .......... 365/185.09 |

OTHER PUBLICATIONS

Ali Sheikholeslami et al., *A Survey of Circuit Innovations in Ferroelectric Random-Access Memories*, Proc. of the IEEE, vol. 88, No. 5, 667 (May 2000).

Ali Sheikholeslami, *Ferroelectric Memory Design (FeRAM 101)*, ISSCC 2002 Tutorial (Feb. 3, 2002).

* cited by examiner

*Primary Examiner*—Trong Phan
(74) *Attorney, Agent, or Firm*—Frederick J. Telecky, Jr.; W. James Brady, III

(57) ABSTRACT

A memory circuit and method for reducing gate oxide stress is disclosed. A first data word is stored at a first address in a nonvolatile memory circuit 604. The first address 820 and the first data word 842 are stored in a volatile memory circuit 602. A first external address 608 is applied to the volatile memory circuit. The first external address is compared to the first address. The first data word is produced from the volatile memory circuit on a data bus 610 when the first external address matches the first address. The first data word is produced from the nonvolatile memory circuit on the data bus when the first external address does not match the first address.

22 Claims, 8 Drawing Sheets

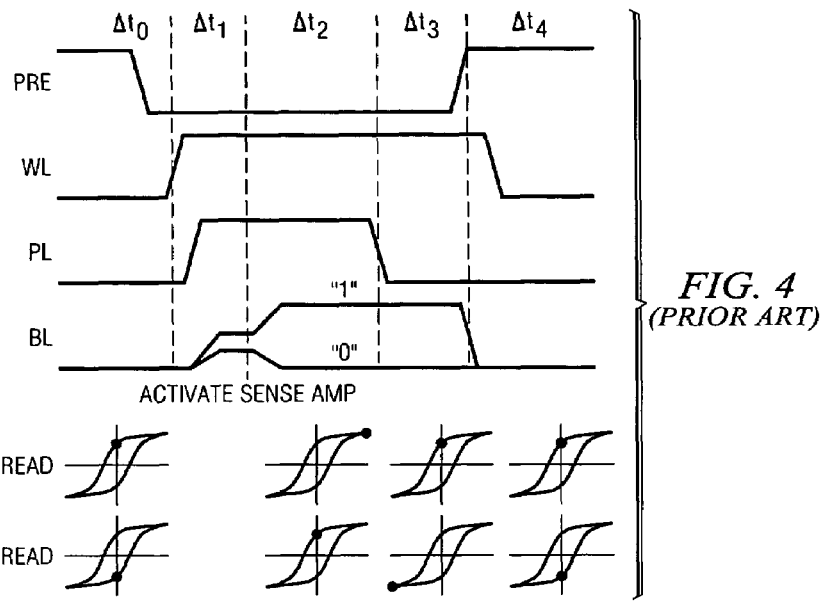
FIG. 4 *(PRIOR ART)*
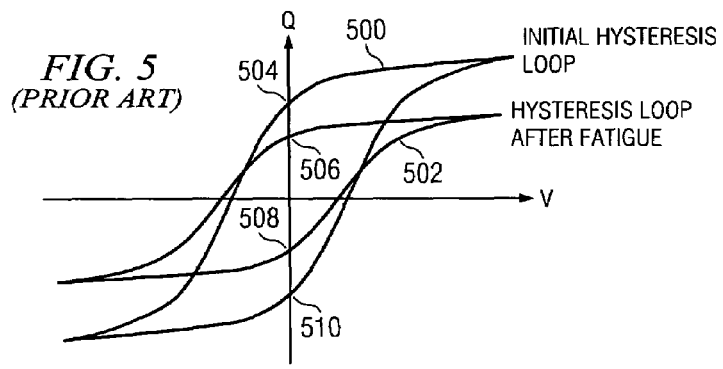
FIG. 5 *(PRIOR ART)*
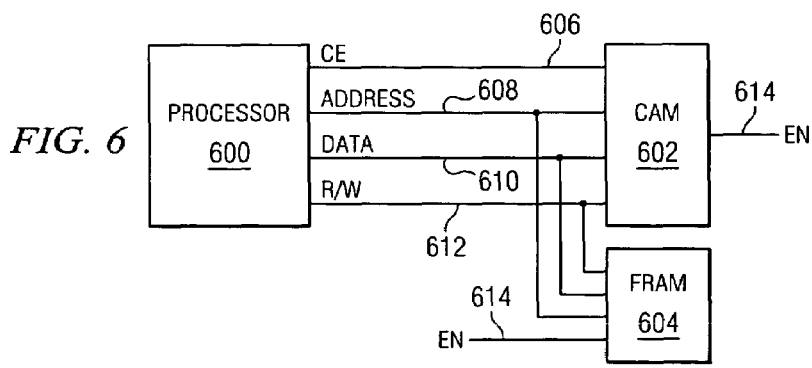
FIG. 6

CIRCUIT AND METHOD FOR REDUCING FATIGUE IN FERROELECTRIC MEMORIES

FIELD OF THE INVENTION

This invention generally relates to electronic circuits, and more specifically to nonvolatile semiconductor integrated circuits.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Many new applications, however, require the access time and packing density of previous generation nonvolatile memories in addition to low power consumption for battery powered circuits. One nonvolatile memory technology that is particularly attractive for these low power applications is the ferroelectric memory cell. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. SBT has several advantages over PZT. However, both ferroelectric materials suffer from imprint and fatigue. Imprint is a tendency to prefer one state over another if the ferroelectric capacitor remains in that state for a long time. Fatigue is characterized by a gradual decrease in net stored charge with repeated cycling of a ferroelectric capacitor. Fatigue, therefore, is directly related to the number of memory accesses of a ferroelectric memory cell. Moreover, fatigue may be significantly greater for reference or dummy cells in the ferroelectric memory. These reference or dummy cells are accessed every time a memory cell on their respective column is accessed to produce a reference voltage on a reference bit line for comparison with a data bit line. Thus, fatigue for a reference or dummy cell may be two orders of magnitude greater than for a normal memory cell.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor 100 is connected between plateline 110 and storage node 112. Access transistor 102 has a current path connected between bitline 108 and storage node 112. A control gate of access transistor 102 is connected to wordline 106 to control reading and writing of data to the ferroelectric memory cell. This data is stored as a polarized charge corresponding to cell voltage $V_{CAP}$. Capacitance of bitline BL is represented by capacitor $C_{BL}$ 104.

Referring to FIG. 2, there is a hysteresis curve corresponding to the ferroelectric capacitor 100. The hysteresis curve includes net charge Q or polarization along the vertical axis and applied voltage along the horizontal axis. By convention, the polarity of the ferroelectric capacitor voltage is defined as shown in FIG. 1. A stored "0", therefore, is characterized by a positive voltage at the plateline terminal with respect to the access transistor terminal. A stored "1" is characterized by a negative voltage at the plateline terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual chargeQr remains in the switching component. The stored "0" is rewritten as a "1" by reversing the polarity of Vmax across the ferroelectric capacitor. This charges the linear and switching components of the ferroelectric capacitor to a saturation charge of −Qs. The stored charge reverts to −Qr when the voltage across the ferroelectric capacitor is removed. Finally, coercive points $V_c$ and $-V_c$ are minimum voltages on the hysteresis curve that will degrade a stored data state. For example, application of $V_c$ across a ferroelectric capacitor will degrade a stored "1" even though it is not sufficient to store a "0". Thus, it is particularly important to avoid voltages near these coercive points unless the ferroelectric capacitor is being accessed.

Referring to FIG. 3, there is illustrated a typical write sequence for a ferroelectric memory cell as in FIG. 1. Initially, the bitline (BL), wordline (WL), and plateline (PL) are all low. The upper row of hysteresis curves illustrates a write "1" and the lower row represents a write "0". Either a "1" or "0" is initially stored in each exemplary memory cell. The write "1" is performed when the bitline BL and wordline WL are high and the plateline PL is low. This places a negative voltage across the ferroelectric capacitor and charges it to −Qs. When plateline PL goes high, the voltage across the ferroelectric capacitor is 0 V, and the stored charge reverts to −Qr. At the end of the write cycle, both bitline BL and plateline PL go low and stored charge −Qr remains on the ferroelectric capacitor. Alternatively, the write "0" occurs when bitline BL remains low and plateline PL goes high. This places a positive voltage across the ferroelectric capacitor and charges it to Qs representing a stored "0". When plateline PL goes low, the voltage across the ferroelectric capacitor is 0 V, and the stored charge reverts to Qr representing a stored "0".

A read operation is illustrated at FIG. 4 for the ferroelectric memory cell at FIG. 1. The upper row of hysteresis curves illustrates a read "0". The lower row of hysteresis curves illustrates a read "1". Wordline WL and plateline PL are initially low. Bitlines BL are precharged low. At time $\Delta t_0$ bitline precharge signal PRE goes low, permitting the bitlines BL to float. At time $\Delta t_1$ both wordline WL and plateline PL go high, thereby permitting each memory cell to share charge with a respective bitline. A stored "1" will share more charge with parasitic bitline capacitance $C_{BL}$ and produce a greater bitline voltage than the stored "0" as shown. A reference voltage (not shown) is produced at each complementary bitline of an accessed bitline. This reference voltage is between the "1" and "0" voltages. Sense amplifiers are activated at the time boundary between $\Delta t_1$ and $\Delta t_2$. When respective bitline voltages are fully amplified in time $\Delta t_2$, the read "0" curve cell charge has increased from Qr to Qs. By way of comparison, the read "1" data state has changed from a stored "1" to a stored "0". Thus, the read "0" operation is nondestructive, but the read "1" operation is destructive. At time $\Delta t_3$, plateline PL goes low and applies −Vmax to the read "1" cell, thereby storing −Qs. At the same time, zero voltage is applied to the read "0" cell and charge Qr is restored. At the end of time $\Delta t_3$, signal PRE goes high and precharges both bitlines BL to zero volts or ground. Thus, zero volts is applied to the read "1" cell and −Qr is restored.

The curves of FIG. 5 illustrate the effect of fatigue on a ferroelectric memory capacitor such as capacitor 100 of FIG. 1. The initial hysteresis curve is characteristic of a ferroelectric capacitor prior to fatigue. Repeated accesses to an individual ferroelectric capacitor cause a noticeable shift to hysteresis curve 502. The residual charge Qr, corresponding to a stored zero, has significantly degraded from point 504 to point 506. Likewise, the residual charge −Qr, corresponding to a stored one, has decreased from point 510 to point 508. The ferroelectric capacitor may be used in an individual memory cell or in a reference cell common to a column of memory cells. Thus, any shift of the hysteresis curve degrades the signal available for either a one or a zero. This degradation is particularly significant, however, for a reference cell which is accessed simultaneously with any other cell of the column.

Studies have shown a typical fatigue rate for ferroelectric capacitors on the order of $10^{12}$ cycles. By way of comparison, a typical electrically erasable programmable read only memory (EEPROM) will sustain $10^6$ write and $10^{15}$ read cycles, respectively. Thus, a commercially feasible ferroelectric memory cell or reference cell should sustain at least $10^{14}$ read cycles. This is approximately two orders of magnitude greater than present ferroelectric capacitor fatigue rates.

SUMMARY OF THE INVENTION

In accordance with a preferred embodiment of the invention, there is disclosed a method for reducing fatigue in a ferroelectric memory circuit. The method includes applying an external address to the memory circuit. The external address is compared to a stored address. A volatile memory circuit produces data when the external address matches the stored address. A nonvolatile memory circuit produces data when the external address does not match the stored address. Fatigue is greatly reduced by reducing access to the nonvolatile memory circuit.

BRIEF DESCRIPTION OF THE DRAWINGS

The foregoing features of the present invention may be more fully understood from the following detailed description, read in conjunction with the accompanying drawings, wherein:

FIG. 4 is a timing diagram showing a read operation from the ferroelectric memory cell of FIG. 1;

FIG. 5 is a hysteresis curve of a ferroelectric capacitor 100 of FIG. 1 after fatigue;

FIG. 6 is a circuit diagram of a computer system of the present invention;

DETAILED DESCRIPTION OF PREFERRED EMBODIMENTS

Figure 1:
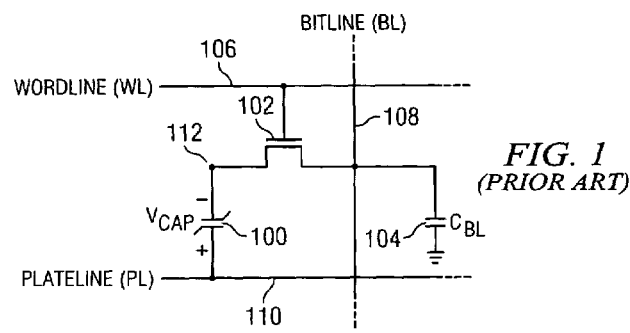
FIG. 1 is a circuit diagram of a ferroelectric memory cell of the prior art.
Figure 2:
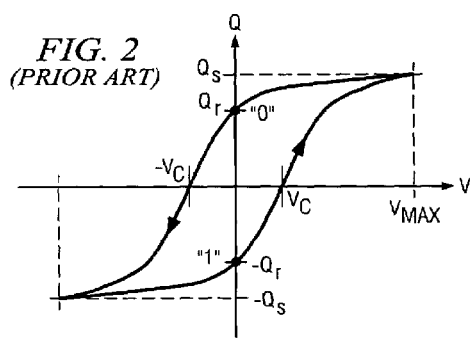
FIG. 2 is a hysteresis curve of the ferroelectric capacitor 100 of FIG. 1.
Figure 3:
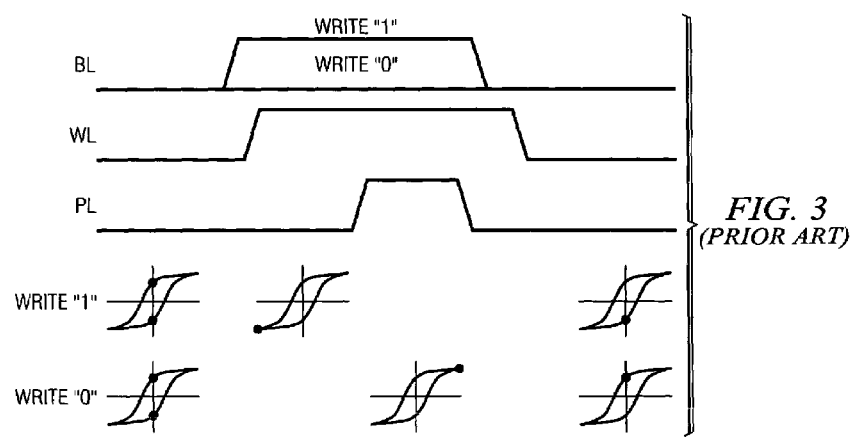
FIG. 3 is a timing diagram showing a write operation to the ferroelectric memory cell of FIG. 1.

Referring to FIG. 6, there is a computer system of the present invention for reducing fatigue in a ferroelectric memory circuit. The computer system includes a processor 600 coupled to an address bus 608, a data bus 610, and control leads for a chip enable (CE) control signal 606 and a read/write (R/W) control signal 612. The processor may be a conventional microprocessor, a digital or graphics signal processor, a memory controller, or other processor known to those of ordinary skill in the art. A content addressable memory circuit (CAM) 602 is coupled to the address 608 and data 610 buses and is coupled to receive the chip enable signal CE on lead 606. The content addressable memory circuit produces enable signal EN on lead 614. A ferroelectric memory circuit (FRAM) 604 is coupled to the address 608 and data 610 buses and is coupled to receive the read/write control signal R/W on lead 612 and the enable signal EN on lead 614.

In operation, the processor initiates a read cycle by applying a high level chip enable signal CE to lead 606 and a high level read/write R/W signal to lead 612. The processor places an address of a data word in FRAM 604 on address bus 608. FRAM 608, however, is initially disabled by a low level of enable signal EN on lead 614. The CAM 602 receives the signal CE on lead 606, the read/write signal R/W on lead 612, and the external address on bus 608. The CAM 602 compares the external address on bus 608 to each stored address in an address table. If a match is found, enable signal EN remains low, and the CAM 602 produces a data word corresponding to the stored address on data bus 610. Since the FRAM 604 remains disabled, there is no fatigue of the internal ferroelectric memory cells. This is particularly advantageous for frequently accessed memory cells or columns of memory cells having a common reference cell or dummy cell. Since neither the memory cell nor the corresponding reference or dummy cell for the column is accessed, both avoid degradation due to fatigue.

When the CAM 602 fails to find a match between the external address on bus 608 and a stored internal address during a read cycle, it produces a high level enable signal EN on lead 614. This high level signal EN enables the FRAM 604. FRAM 604 receives the high level signal R/W on lead 612 and the external address on bus 608. Responsively, FRAM 604 produces a data word corresponding to the external address on data bus 610. Furthermore, the high level of enable signal EN causes the external address on bus 608 and the data on bus 610 to be stored in CAM 602 at a location indicated by an address table pointer 880 (FIG. 8) as will be described in detail. The processor 600 then receives the data word on bus 610. The read cycle is terminated when enable signal EN goes low, thereby disabling FRAM 604 and incrementing the address table pointer to point to a next internal address.

The processor initiates a write cycle by applying a high level chip enable signal CE to lead 606 and a low level read/write R/W signal to lead 612. The processor places an external address on bus 608 and a data word on data bus 610. As in a read cycle, however, FRAM 608 is initially disabled by a low level of enable signal EN on lead 614. The CAM 602 receives the signal CE on lead 606, read/write signal R/W on lead 612, and the external address on bus 608. In response to the low level of signal R/W, the CAM 602 produces a high level enable signal EN on lead 614. This high level signal EN is applied to FRAM 604 which, in turn, stores the data word on bus 610 at an internal address designated by the address on bus 608.

The CAM 602 again compares the external address on bus 608 to each stored address in an address table. If a match is found, the CAM 602 stores the data word on bus 608 in a data table at an address corresponding to the matching stored internal address. Alternatively, if no match is found, the CAM 602 stores both the external address on bus 608 and the data word on bus 610 in respective address and data tables at locations indicated by an address table pointer 880 (FIG. 8) as will be described in detail. The write cycle is terminated when enable signal EN goes low, thereby disabling FRAM 604 and incrementing the address table pointer 880 to point to a next internal address.

Figure 7:
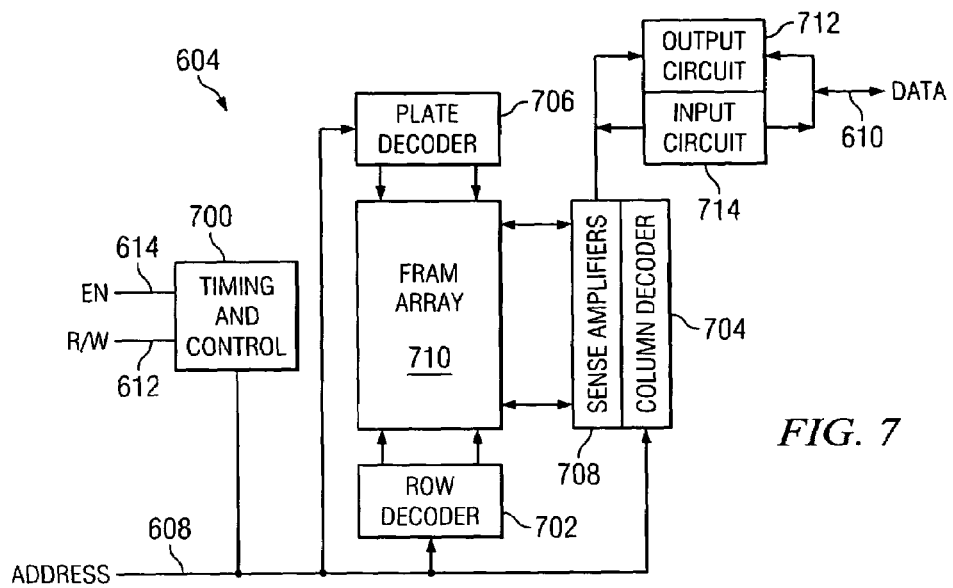
FIG. 7 is a circuit diagram of the ferroelectric memory 604 of FIG. 6.

Referring now to FIG. 7, there is a simplified schematic diagram of the FRAM 604 of FIG. 6. For simplicity, the same reference numerals are used for corresponding elements of FIG. 6. A timing and control circuit 700 is coupled to receive enable signal EN on lead 614 from CAM 602 as well as read/write signal R/W on lead 612 and an external address on bus 608. The timing and control circuit generates internal timing signals and address transition signals (not shown) to control internal operation of the FRAM 604 during read and write cycles. In this exemplary embodiment, a 6 Mbit FRAM array 710 is organized as 196,608 32-bit words.

During a read cycle, the timing and control circuit receives high level signals EN on lead 614 and R/W on lead 612 and an 18-bit address on bus 608. A row decoder circuit 702, a plate decoder circuit 706, and a column decoder circuit 704 are coupled to receive respective address bits from bus 608. Responsively, the FRAM array produces a plurality of data bits that are received and amplified by sense amplifiers 708. Column decoder circuit 704 selects one 32-bit data word from sense amplifiers 708 in response to the column address bits on bus 608. This selected 32-bit data word is applied to output circuit 712. Output circuit 712 further amplifies the data ward on data bus 610 to overwrite a data location in CAM 602 indicated by address table pointer 880 (FIG. 8) as will be described in detail.

A write cycle proceeds in much the same manner as a read cycle except that control signal R/W has a low level and a 32-bit data word is applied to data bus 610 by processor 600. This 32-bit data word is amplified by input circuit 714 to overwrite respective sense amplifiers 708 corresponding to column address bits on bus 608. These sense amplifiers restore data to ferroelectric memory cells in rows of FRAM array 710 designated by row decoder 702 and plate decoder 706 corresponding to row and plate address bits, respectively, on bus 608.

Figure 8:
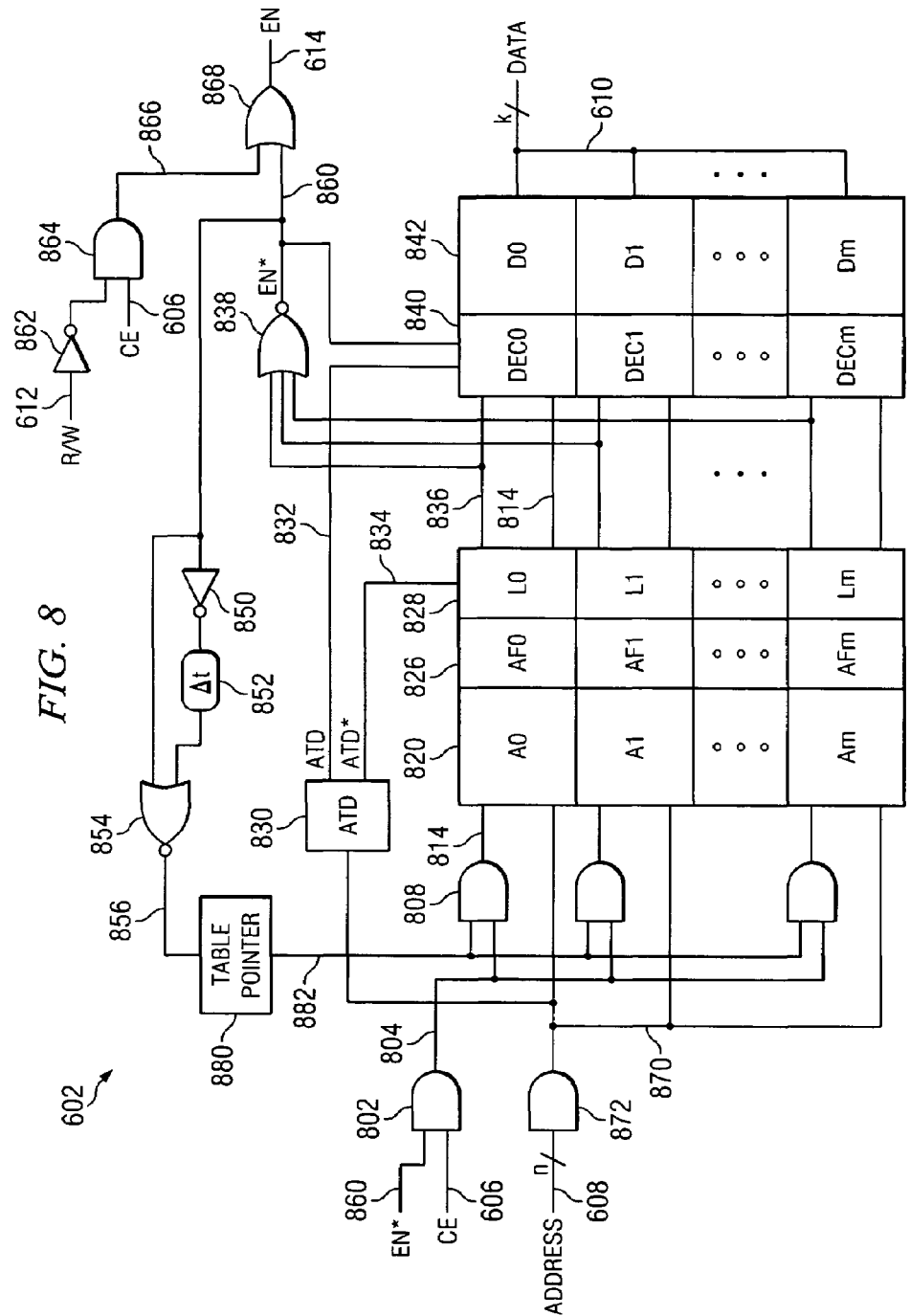
FIG. 8 is a circuit diagram of the content addressable memory 602 of FIG. 6.

Turning now to FIG. 8, the structure and operation of the CAM 602 will be explained in detail. The exemplary embodiment of the CAM 602 includes a 32-word address table A0–Am and a corresponding 32-word data table D0–Dm. The structure of each address table word is the same, so only one will be described in detail. Likewise, the structure of each data table word is the same, so only one will be described in detail.

The first address table word A0 includes an 18-bit address 820 corresponding to the location in the FRAM 604 of data word D0 842. Once the first entry of the data table is filled during normal operation, therefore, data word D0 will be stored in the data table and in the FRAM at an address designated by the address table word A0. The first address table word also includes an address flag bit AF0 826 which indicates whether the first address and data table entries are valid. Finally, the first address table word includes a latch L0 828 which latches the match signal line 836. Each of the 32 address table words is selected by a respective address from address table pointer 880 which is applied to a respective AND gate decoder such as AND gate decoder 808 via bus 882. Address table pointer 880 is a 5-bit circular counter which is initialized to zero to point to the first address table word.

Initial Access Cycle

Figure 13:
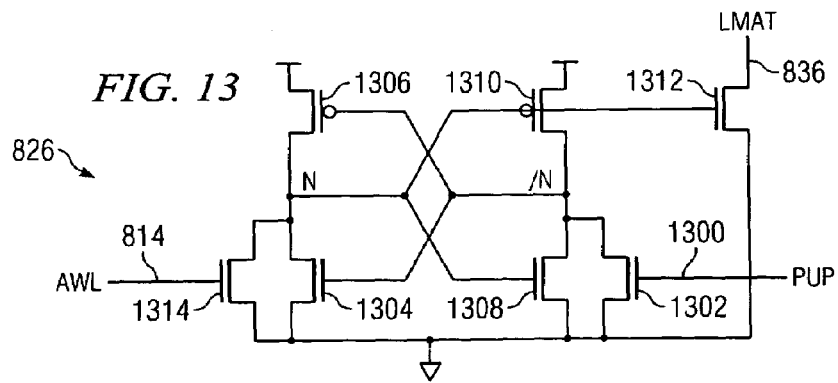
FIG. 13 is a circuit diagram of an address flag cell of the content addressable memory of FIG. 6.

In operation, an external 18-bit address is applied to respective memory cells of each address table word A0–Am simultaneously via bus 608. This external address passes through 18 respective address buffers 872 enabled by the chip enable signal CE on lead 606. The address buffers produce corresponding true and complementary internal address bits on bus 870. When this internal address on bus 870 is first applied to the address table, neither the address word A0 820 nor the data word D0 842 will have valid data. Referring to FIG. 13, the address flag bit AF0 826 is initially set by a high level power up pulse PUP on lead 1300 to indicate this condition. The high level pulse turns on N-channel transistor 1302, thereby pulling terminal /N to ground. The low level on terminal /N turns off N-channel transistor 1304 and turns on P-channel transistor 1306, thereby pulling terminal N high. The high level of terminal N turns on N-channel transistor 1308 and turns off P-channel transistor 1310, thereby latching terminal /N low. The high level of terminal N also turns on N-channel transistor 1312 which pulls match lead LMAT 836 to ground. Match lead LMAT is common to each bit of the address table. The initial low level of match lead LMAT indicates that the internal address on bus 870 does not match the word A0 stored in the address table.

Figure 12:
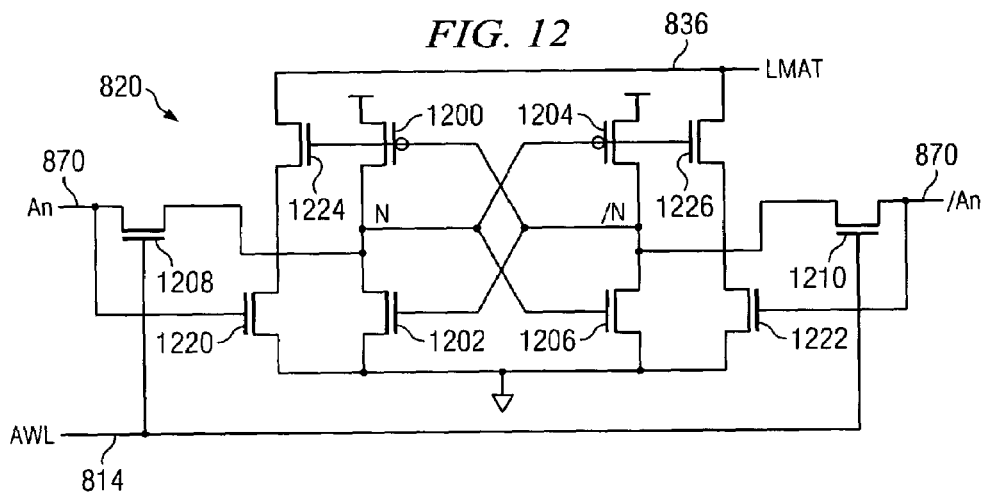
FIG. 12 is circuit diagram of a memory cell of the address table of the content addressable memory of FIG. 6.

Each bit of the 18-bit internal address on bus 870 is applied to a corresponding memory cell of word A0 820 as shown at FIG. 12. The internal address bus 870 includes true and complementary address signals An and /An, respectively. The memory cell of FIG. 12 includes a latch formed by P-channel transistors 1200 and 1204 and N-channel transistors 1202 and 1206. The state of the latch is initially unknown, so the level of terminals N and /N is also unknown. Match lead 836, however, is initially held low by address flag bit AF0 as previously explained. Referring back to FIG. 8, the initial low level of match lead LMAT 836 and 31 other match leads from the address table are applied to NOR gate 838, thereby producing a high level enable signal EN* on lead 860. OR gate 868 receives this high level signal on lead 860 and produces a high level enable signal EN on lead 614. This high level enable signal EN* on lead 860 is applied to AND gate 802 together with chip enable signal CE on lead 606 to produce a high level address table enable signal on lead 804. This enable signal on lead 804 selectively enables each address table decoder including AND gate decoder 808. Each AND gate decoder also receives a 5-bit address from address table pointer 880 on bus 882 to indicate which of the 32-bit address table words will store the address of data from FRAM 604. This 5-bit address is initialized to zero, thereby selecting the first address table word. Thus, AND gate decoder 808 produces a high level address word line signal AWL on lead 814. Word line signals for the 31 other address table words remain low.

Referring now to FIG. 12, the address word line signal AWL on lead 814 turns on N-channel write transistors 1208 and 1210. These write transistors 1208 and 1210 conduct the levels of address signals An and /An to terminals N and /N, respectively, thereby setting the latch and storing the address on internal address bus 870 in address table word A0 820. Furthermore, referring to FIG. 13, the address word line signal AWL on lead 814 turns on N-channel transistor 1314 which pulls terminal N to ground. The low level of terminal N turns on P-channel transistor 1310 and turns off N-channel transistor 1308, pulling terminal /N high. The high level of terminal /N turns off P-channel transistor 1306 and turns on N-channel transistor 1304, thereby latching terminal N low. The low level of terminal N turns off N-channel transistor 1312, thereby releasing the common match lead 836 and indicating valid data is stored in address table word A0. Match lead signal LMAT 836, however, temporarily remains low.

Figure 9:
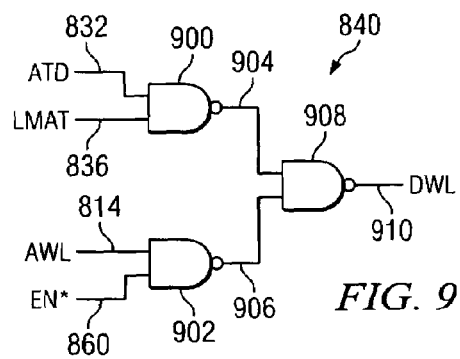
FIG. 9 is a circuit diagram of the decode circuit 840 of FIG. 8.

Referring now to FIG. 9, there is a schematic diagram of data table decoder circuit DEC0 840 which produces data word line signal DWL on lead 910. The structure of all data table decoders is the same, so only operation of decoder circuit DEC0 will be discussed in detail. NAND gate 900 of decoder circuit 840 receives address transition signal ATD on lead 832 and match lead signal LMAT on lead 836. NAND gate 902 receives the address word line signal AWL on lead 832 and enable signal EN* on lead 860. In operation, NAND gate 900 produces a low level output signal on lead 904 when a match is detected between the external address on bus 608 and an address stored in the address table. Alternatively, NAND gate 902 produces a low level output signal on lead 906 when no match is detected between the external address on bus 608 and an address stored in the address table. Thus, 1 of 32 data word line signals DWL will be driven high in each read or write cycle regardless of address match conditions. For the initial access of the address and data tables, match lead LMAT on lead 836 remains low as previously stated. Address word line AWL on lead 814 and enable signal EN* on lead 860 are both high.

The signal on lead 906 goes low so that NAND gate 908 produces a high level data word line signal DWL on lead 910.

Figure 15:
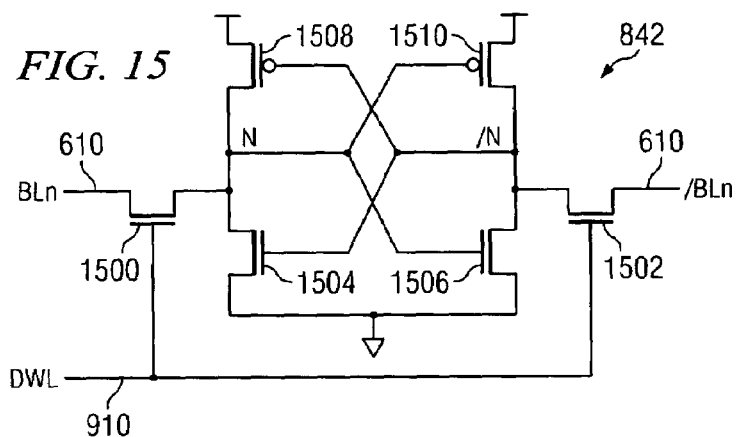
FIG. 15 is a circuit diagram of a memory cell of the data table of the content addressable memory of FIG. 6.

Referring to FIG. 15, there is a schematic diagram of 1 of 32 memory cells of data word D0 842. Each memory cell is coupled to receive complementary data bit signals BLn and /BLn on data bus 610. The high level of data word line DWL on lead 910 turns on N-channel transistors 1500 and 1502, thereby conducting the signal levels of data bit signals BLn and /BLn to terminals N and /N, respectively. These signal levels set the latch formed by N-channel transistors 1504 and 1506 and P-channel transistors 1508 and 1510. Thus, the data word produced by FRAM 604 on bus 610 is stored in data word D0 842.

Figure 14:
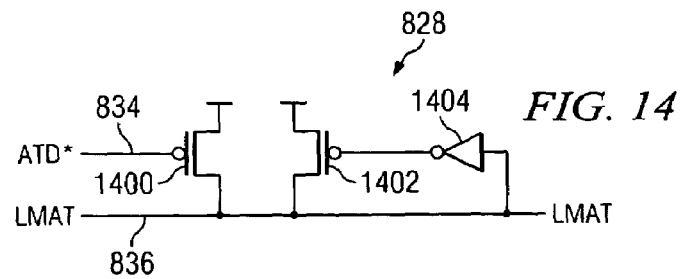
FIG. 14 is a circuit diagram of a latch cell of the content addressable memory of FIG. 6.

Referring back to FIG. 8 together with FIG. 10, termination of the initial access cycle will be described in detail. Address transition detector 830 receives initial address transition signals 1000 and produces a high level address transition signal 1002 for a short time after the address signals are stable. No match is detected on the initial access cycle whether read or write. Match lead signal LMAT on lead 836, therefore, is held low 1012 by address flag bit 826 as previously described. NOR gate 838 and OR grate 868 respectively produce high level enable signals EN* on lead 860 and EN 1014 on lead 614. A low level pulse ATD* 1006 (on lead 834 at FIG. 8) is produced by the falling edge 1004 of signal ATD). This low level pulse ATD* is applied to the gate of P-channel transistor 1400 (on lead 834 at FIG. 14) of latch circuit L0. Accordingly, P-channel transistor 1400 pulls match lead signal LMAT high 1018. Inverter 1404 subsequently produces a low level signal at the gate of P-channel transistor 1402, thereby latching lead match signal LMAT high. The high level of signal LMAT drives enable signal EN low 1014. The falling edge of enable signal EN* is applied to NOR gate 854 to produce a high level 1016 increment signal INC on lead 856. This high level increment signal INC increments the 5-bit address table pointer to point to the second address table word A1. The falling edge of enable signal EN applied to inverter 850 produces a high level signal at delay stage 852. After a time delay Δt, the delay stage 852 applies a high level input signal to NOR gate 854, thereby terminating the increment pulse INC and the initial access cycle.

Read Cycle

Figure 10:
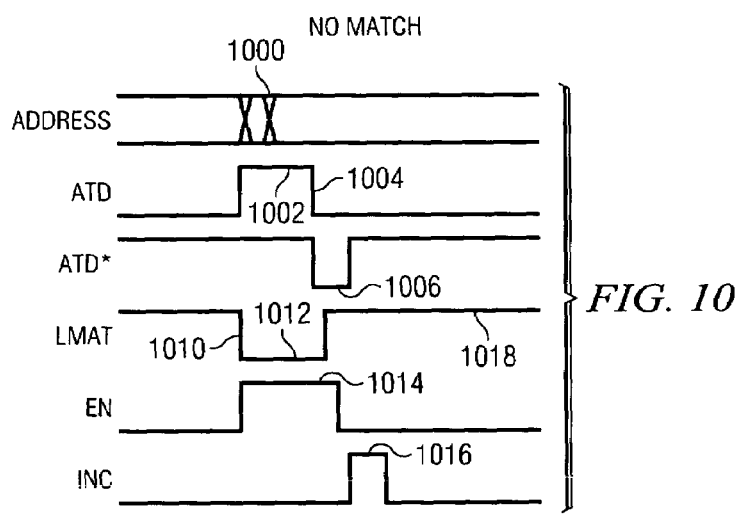
FIG. 10 is a timing diagram showing operation of the content addressable memory 602 of FIG. 6 when the external address does not match any stored address.

A read cycle that fails to detect a match between an external address on bus 608 and a stored address in the address table (FIG. 8) proceeds in the same manner as the initial access cycle except that lead match signal LMAT is initially high from a previous cycle (FIG. 10). A processor 600 (FIG. 6) applies control and address signals to the CAM 602 and the FRAM 604. The address on bus 608 is buffered by address buffers 872 (FIG. 8) and applied simultaneously to individual memory cells (FIG. 12) of the address table via internal address bus 870. At least one individual memory cell will store an address bit that does not match the address bit on internal bus 870. For example, if address signals An and /An are high and low, respectively, then N-channel transistors 1220 and 1222 are on and off, respectively. Furthermore, terminals N and /N are low and high, respectively, so that N-channel transistors 1224 and 1226 are on and off, respectively. Thus, a conductive path through series-connected N-channel transistors 1220 and 1224 pulls lead match signal LMAT on lead 836 low 1010 (FIG. 10). This low level lead match signal LMAT produces high level enable signals EN* on lead 860 and EN on lead 614. Enable signal EN* enables the address table decoders such as 808 to store the current address in an address table word indicated by address table pointer 880. Enable signal EN enables FRAM 604 to produce a data word on bus 610. This data word is then written into a data table word corresponding to the address table word. The read cycle is terminated when address transition detector signal ATD* precharges each lead match signal LMAT high, thereby driving enable signal EN low. NOR gate 854 produces increment signal INC 1016 on lead 856 to increment the address table pointer 880 to point to the next address table word.

Figure 11:
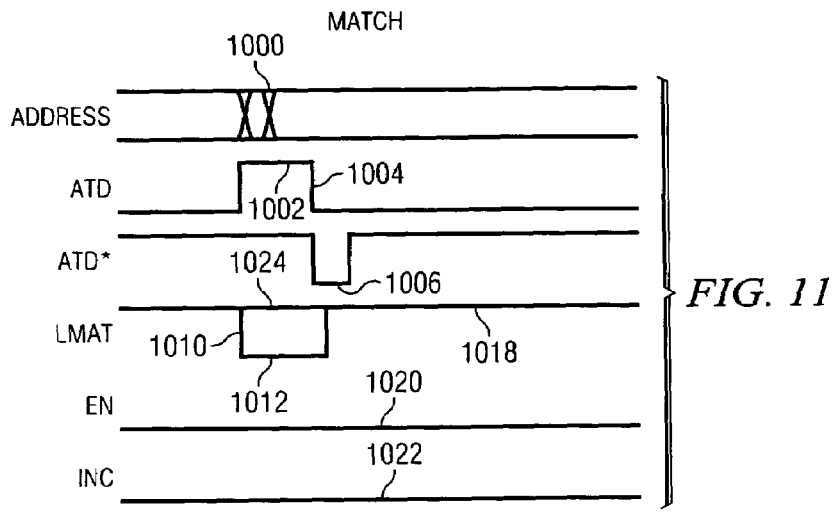
FIG. 11 is a timing diagram showing operation of the content addressable memory 602 of FIG. 6 when the external address matches a stored address.

A read cycle that detects a match between the address on bus 608 and a stored internal address does not drive lead match signal LMAT low. Address buffer 872 produces complementary address signals An and /An on internal address bus 870. Address signals An and /An are applied to N-channel transistors 1220 and 1222, respectively (FIG. 12). Since the signals on terminals N and /N match address signals An and /An, respectively, one of N-channel transistors 1220 and 1224 will be on and the other will be off. Likewise, one of N-channel transistors 1222 and 1226 will be on and the other will be off. Thus, no conductive path is established through any memory cell of one of the address words in the address table. For example, if address table word A0 820 matches the address on bus 608, then latch circuit L0 holds lead match signal LMAT 836 high 1024 (FIG. 11). All other 31 lead match signals of the address table have at least one memory cell that does not match a corresponding address bit. These 31 lead match signals are driven low 1012. The high lead match signal LMAT on lead 836, however, produces a low output signal from NOR gate 838 and a corresponding low enable signal EN on lead 614. This low enable signal EN inhibits operation of the FRAM 604 and output circuit 712 remains in a high impedance state with respect to data bus 610 (FIG. 7). The low enable signal EN* from NOR gate 838 on lead 860 also produces a low output signal from AND gate 802 on lead 804. This low signal on lead 804 disables address table decoders such as AND gate 808. Thus, all address word line signals AWL remain low and address words in the address table remain unchanged.

Address transition detector circuit 830 produces signal ATD on lead 832. This ATD signal together with the high level lead match signal LMAT on lead 836 are applied as inputs to NAND gate 900 (FIG. 9) of data table decoder DEC0 840. NAND gate 900 produces a low output signal on lead 904. In response to this low level on lead 904, NAND gate 908 produces a high level data table word line signal DWL on lead 910. This high level data table word line signal couples each memory cell of the data table word D0 to a respective bit BLn and /BLn of the data bus 610, thereby producing a stored data word D0 without accessing FRAM 604. This is highly advantageous in reducing fatigue of ferroelectric memory cells in the FRAM. For example, the intrinsic fatigue rate of the FRAM process is about $10^{12}$ cycles. If maximum repetitive access to memory cells in the FRAM is reduced by a factor of 10, then the fatigue rate of the FRAM is increased to $10^{13}$ cycles. Moreover, if maximum repetitive access to memory cells in the FRAM is reduced by a factor of 100, then the fatigue rate of the FRAM is increased to $10^{14}$ cycles. This is a generally accepted fatigue rate for commercial FRAM products. Although the CAM of this exemplary embodiment only employs 32 words in each of the address and data tables, the table lengths may easily be adjusted for compatibility with the FRAM size and access pattern to reduce the fatigue rate as desired.

Write Cycle

A write cycle is initiated when processor 600 places an address on bus 608, a high level chip enable signal CE on lead 606, and a low level read/write signal R/W on lead 612. The CAM 602 initially attempts to match the address on bus 608 with an address stored in the address table in the same manner as the read cycle. If no match is detected, all 32 lead match signals such as LMAT on lead 836 are driven low. This low level of all lead match input signals to NOR gate 838 produces a high level enable signal EN* on lead 860. A high level of enable signal EN on lead 614 is produced in response to the low level of read/write signal R/W on lead 612 and a high level of chip enable signal CE on lead 606 applied to AND gate 864 without regard to the level of enable signal EN*. High levels of enable signal EN* and chip enable signal CE are subsequently applied to AND gate 802, thereby enabling address table decoders such as AND gate 808. One of the address table decoder circuits designated by the current address in address table pointer circuit 880, for example, decoder circuit 808 will produce a high level address word line signal AWL on lead 814. This high level address word line signal AWL loads the address on internal address bus 870 into the corresponding address table word A0 820. The high level of the address word line AWL 814 is also applied to NAND gate 902 (FIG. 9) together with the high level of enable signal EN* on lead 860. This produces a low level signal on lead 906 and a corresponding high level data word line DWL signal on lead 910. The high level data word line signal DWL on lead 910 loads the 32-bit data word on bus 610 into corresponding data table word D0 842. In the case of a write cycle where no address match is detected, therefore, both address and data table words of the CAM designated by address table pointer 880 are loaded with a new address from the address bus 608 and a new data word from the data bus 610.

The write cycle is terminated as previously described with reference to FIG. 10. Address transition signal ATD* goes low, thereby precharging all lead match signals LMAT high. This high level of lead match signals returns enable signal EN* to a low state, thereby disabling address table decoders and returning address word lines AWL and data word lines DWL to their initial low levels. Finally, the high-to-low transition of enable signal EN* produces an increment pulse INC from NOR gate 854 on lead 856. The increment pulse increments the address table pointer to point to the next address table word.

A write cycle where the CAM 602 successfully matches the address on bus 608 with an address stored in the address table differs slightly from the previously described operation. Referring back to FIG. 11, when one of the address table words matches the external address on bus 608, one of the lead match signals LMAT 1024 will remain at a high level. This high level applied to NOR gate 838 produces a low level enable signal EN* on lead 860. Address table decode circuits such as AND gate 808, therefore, are not enabled via AND gate 802. Thus, all address word line AWL signals remain low and the contents of the address table remain unchanged. The low level of read/write signal R/W on lead 612 produces a high level signal from inverter 862. This high level signal from inverter 862 and the high level of chip enable signal CE on lead 606 cause AND gate 864 to produce a high level output signal on lead 866. The high level on lead 866 applied to OR gate 868 produces a high level enable signal EN on lead 614. This high level of enable signal EN on lead 614 enables FRAM 604 to produce a data word on bus 610 corresponding to the external address on bus 608. Referring now to FIGS. 9 and 11, the high level of address transition detector signal ATD on lead 832 together with the high level of lead match signal LMAT on lead 836 produce a low level output signal from NAND gate 900 on lead 904. This low level on lead 904 produces a high level data word line signal DWL on lead 910. The high level data word line signal DWL loads the data word on bus 608 from FRAM 604 into a current data table word indicated by the high level lead match signal LMAT. In the case of a write cycle where art address match is detected, therefore, only the data table word of the CAM designated by lead match signal LMAT is loaded with a new data word from the data bus 610. The matching address table word remains unchanged and the address pointer is not incremented.

The write cycle is terminated as previously described with reference to FIG. 11. Address transition signal ATD* goes low, thereby precharging all lead match signals LMAT high. This high level of lead match signals returns all lead match signals to their respective high levels 1018 in preparation for the next read or write cycle.

Synchronous Operation

Figure 16:
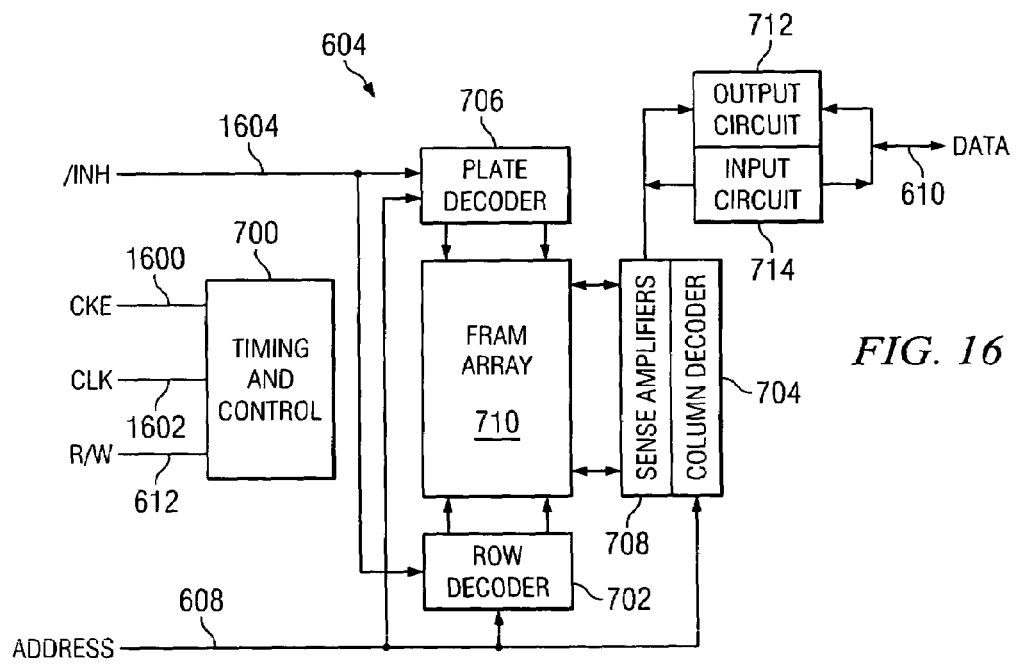
FIG. 16 is a circuit diagram of a synchronous embodiment of the ferroelectric memory 604 of FIG. 6.

Turning now to FIG. 16, there is a circuit diagram of a synchronous embodiment of the FRAM 604 of the present invention. The same reference numerals are used for common components of the synchronous embodiment and the previously described asynchronous embodiment. The synchronous FRAM is coupled to receive clock enable signal CKE on lead 1600 and clock signal CLK on lead 1602 from processor 600 (FIG. 6). The clock enable signal CKE enables the FRAM clock input buffer (not shown) which produces a buffered version of clock signal CLK. The buffered version of clock signal CLK synchronizes internal operations of the FRAM with the processor 600 and with the CAM 602 (FIG. 17) as will be described in detail. The FRAM also receives inhibit signal /INH on lead 1604 from the CAM 602. This inhibit signal /INH is coupled to the plate decoder circuit 706 and to the row decoder circuit 702.

During a read cycle, when inhibit signal /INH on lead 1604 goes low, both row 702 and plate 706 decoder circuits are disabled, thereby terminating the read cycle prior to completion. The sense amplifiers 708 are conditionally enabled if the row decoder circuit 702 is enabled. Thus, the FRAM read cycle in progress is interrupted by the low logic state of inhibit signal /INH and no data is produced on data bus 610. During a write cycle, however, the timing and control circuit 700 decouples the inhibit signal /INH on lead 1604 from the row 702 and plate 706 decoder circuits in response to a low level of read/write control signal R/W on lead 612. The FRAM, therefore, is enabled by clock enable signal CKE and clock signal CLK during a write cycle without regard to the logical state of inhibit signal /INH.

Initial Access Cycle

Figure 17:
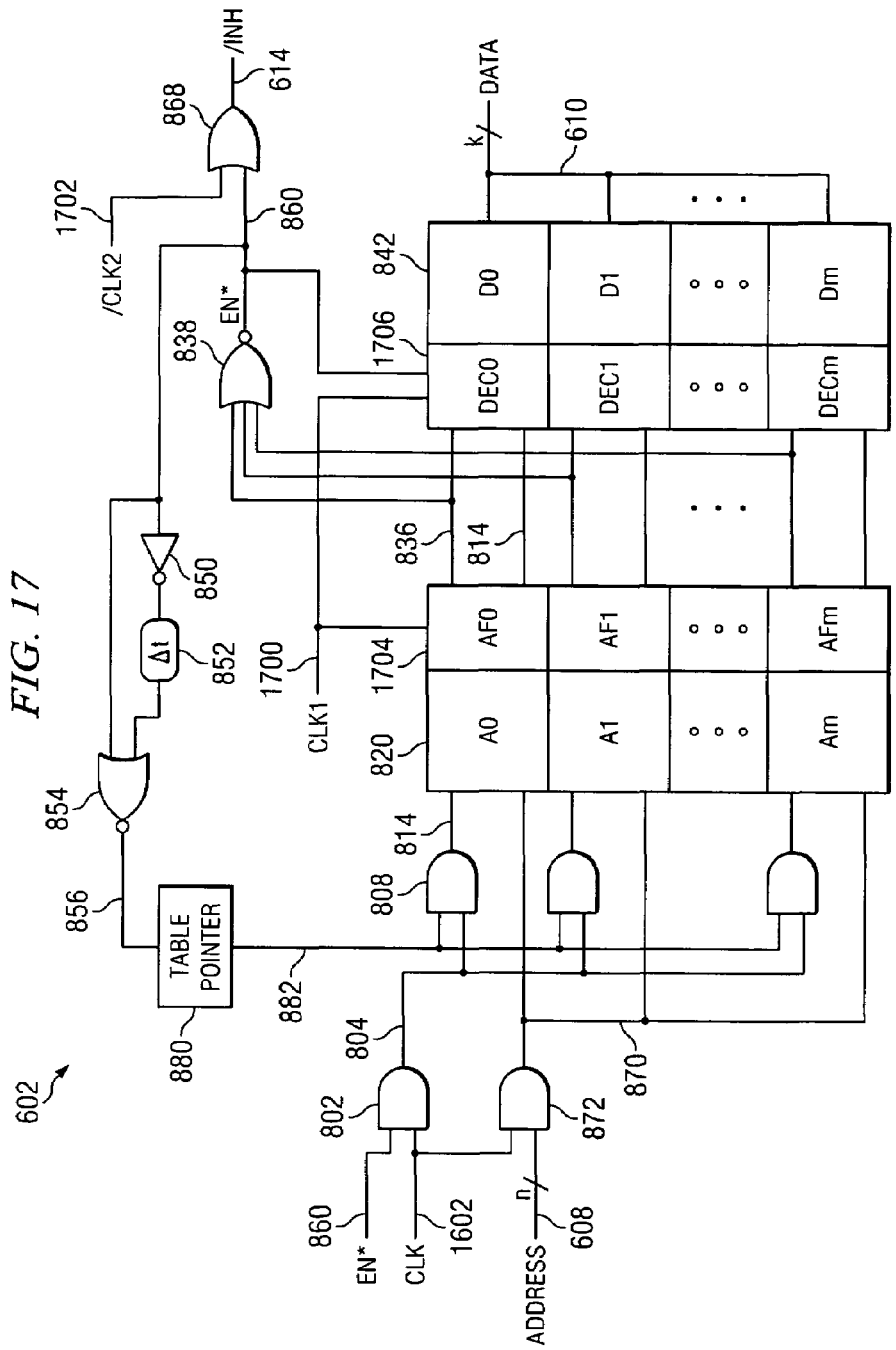
FIG. 17 is a circuit diagram of a synchronous embodiment of the content addressable memory 602 of FIG. 6.

Referring now to FIG. 17, a synchronous embodiment of the CAM 602 will be described in detail. The same reference numerals are used for common components of the synchronous embodiment and the previously described asynchronous embodiment. AND gate 802 and address buffers 872 are coupled to receive clock signal CLK on lead 1602 from processor 600 (FIG. 6). Clock signal CLK1 is a slightly delayed version of clock signal CLK. Clock signal /CLK2 is a slightly delayed and inverted version of clock signal CLK1. Both clock signals CLK1 and /CLK2 are produced by a clock circuit (not shown).

Figure 18:
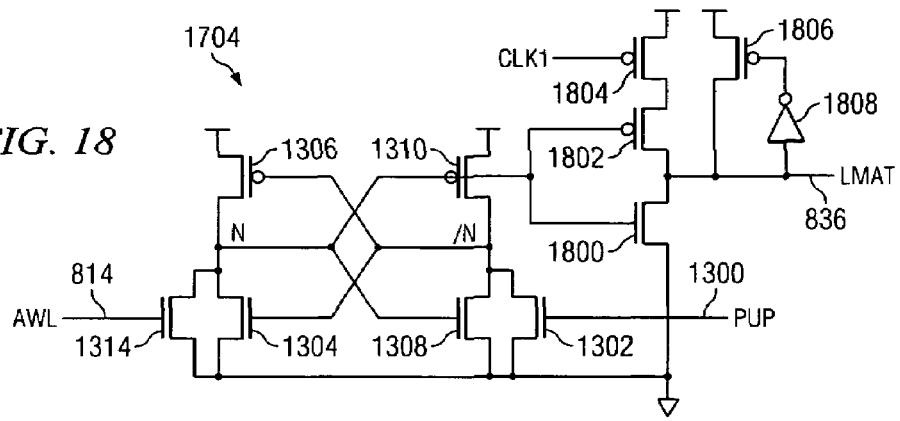
FIG. 18 is a circuit diagram of a synchronous embodiment of an address flag cell of the content addressable memory of FIG. 6.

Processor 600 initiates a memory access with application of high levels of clock enable signal CKE, clock CLK, and an address on bus 608 to FRAM 604 and CAM 602. The 18-bit address on bus 608 is applied to respective memory cells of each address table word A0–Am simultaneously. This external address passes through 18 respective address buffers 872 enabled by the clock signal CLK on lead 1602. The address buffers produce corresponding true and complementary internal address bits on bus 870. When this internal address on bus 870 is first applied to the address table, neither the address word A0 820 nor the data word D0 842 will have valid data. Referring to FIG. 18, the address flag bit AF0 1704 is initially set by a high level power up pulse PUP on lead 1300 to indicate this condition. The high level pulse turns on N-channel transistor 1302, thereby pulling terminal /N to ground. The low level on terminal /N turns off N-channel transistor 1304 and turns on P-channel transistor 1306, thereby pulling terminal N high. The high level of terminal N turns on N-channel transistors 1308 and 1800 and turns off P-channel transistors 1310 and 1802, thereby latching terminal /N low. N-channel transistor 1800 pulls match lead LMAT 836 to ground. The low level of match lead LMAT is inverted by inverter 1808, thereby turning P-channel transistor 1806 off. Match lead LMAT is common to each bit of a respective address table word. The initial low level of match lead LMAT indicates that the internal address on bus 870 does not match the word A0 820 stored in the address table.

Each bit of the 18-bit internal address on bus 870 is applied to a corresponding memory cell of word A0 820 as previously explained with respect to FIG. 12. Match lead 836, however, is initially held low by address flag bit AF0 as previously explained. The initial low level of match lead LMAT 836 and 31 other match leads from the address table are applied to NOR gate 838, thereby producing a high level enable signal EN* on lead 860. OR gate 868 receives this high level signal on lead 860 together with the initial high level of clock signal /CLK2 and produces a high level inhibit signal /INH on lead 614. The high level enable signal EN* on lead 860 is applied to AND gate 802 together with clock signal CLK on lead 1602 to produce a high level address table enable signal on lead 804. This enable signal on lead 804 selectively enables each address table decoder including AND gate decoder 808. Each AND gate decoder also receives a 5-bit address from address table pointer 880 on bus 882 to indicate which of the 32-bit address table words will store the address of data from FRAM 604. This 5-bit address is initialized to zero, thereby selecting the first address table word A0. Thus, AND gate decoder 808 produces a high level address word line signal AWL on lead 814. Word line signals for the 31 other address table words remain low.

Referring back to FIG. 12, the address word line signal AWL on lead 814 turns on N-channel write transistors 1208 and 1210, thereby setting latch terminals N and /N and storing the address on internal address bus 870 in address table word A0 820. Furthermore, referring to FIG. 18, the high level of address word line signal AWL on lead 814 turns on N-channel transistor 1314 which pulls terminal N to ground. The low level of terminal N turns on P-channel transistors 1310 and 1802 and turns off N-channel transistors 1308 and 1800, pulling terminal /N high. The high level of terminal /N turns off P-channel transistor 1306 and turns on N-channel transistor 1304, thereby latching terminal N low and releasing the common match lead 836.

Figure 19:
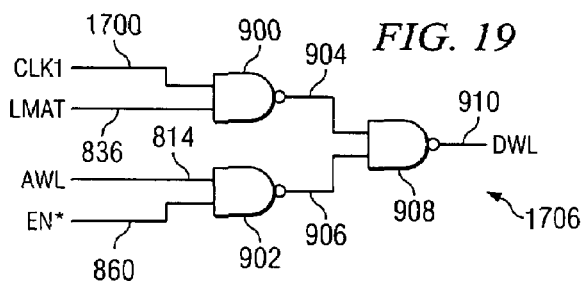
FIG. 19 is a circuit diagram of a synchronous embodiment of the decode circuit 840 of FIG. 8.

Referring now to FIG. 19, there is a schematic diagram of data table decoder circuit DEC0 840 which produces data word line signal DWL on lead 910. The structure of all data table decoders is the same, so only operation of decoder circuit DEC0 will be discussed in detail. NAND gate 900 of decoder circuit 840 receives clock signal CLK1 on lead

1700 and match lead signal LMAT on lead 836. NAND gate 902 receives the address word line signal AWL on lead 814 and enable signal EN* on lead 860. In operation, NAND gate 900 produces a low level output signal on lead 904 when a match is detected between the external address on bus 608 and an address stored in the address table. Alternatively, NAND gate 902 produces a low level output signal on lead 906 when no match is detected between the external address on bus 608 and an address stored in the address table. Thus, 1 of 32 data word line signals DWL will be driven high in each read or write cycle regardless of address match conditions. For the initial access of the address and data tables, match lead LMAT on lead 836 remains low as previously stated. Address word line signal AWL on lead 814 and enable signal EN* on lead 860 are both high. The signal on lead 906 goes low so that NAND gate 908 produces a high level data word line signal DWL on lead 910.

Referring to FIG. 15, memory cells of data word D0 842 are coupled to receive respective complementary data bit signals BLn and /BLn on data bus 610. The high level of data word line DWL on lead 910 turns on N-channel transistors 1500 and 1502, thereby conducting the signal levels of data bit signals BLn and /BLn to terminals N and /N, respectively. These signal levels set the latch formed by N-channel transistors 1504 and 1506 and P-channel transistors 1508 and 1510 as previously explained. Thus, the data word produced by FRAM 604 on bus 610 is stored in data word D0 842.

Referring now to FIG. 17 the initial access cycle terminates when clock signal CLK returns low, thereby disabling address buffers 872 and NAND gate 802. This returns address word line AWL to a low level, thereby producing a high level output from NAND gate 902 at lead 906 (FIG. 9) and a corresponding low data word line signal DWL on lead 910. A short time later, clock signal CLK1 goes low. This low level applied to address flag bit AF0 (FIG. 18), turns on P-channel transistor 1804 and precharges lead match signal LMAT high through P-channel transistor 1802. Inverter 1808 inverts this high level to turn on P-channel transistor 1806, thereby latching lead match signal LMAT high. The high level of lead match signal LMAT produces a low enable signal EN* from NOR gate 838. The high-to-low transition of enable signal EN* produces a high level pulse on lead 856 as previously explained. This high level pulse increments the 5-bit address of table pointer 880 on bus 882, thereby pointing to the next address and data table words. Finally, clock signal /CLK2 returns to a high level, thereby producing a high level inhibit signal /INH and enabling FRAM 604 for the next memory access.

Synchronous Read Cycle

A read cycle is initiated by processor 600 when high levels of clock enable signal CKE, clock signal CLK and read/write signal R/W are applied to FRAM 604 and CAM 602. Both FRAM 604 and CAM 602 are simultaneously enabled by the high level of clock signal CLK on lead 1602. The initial high level of clock signal /CLK2 produces a high level inhibit signal /INH on lead 614 so that FRAM 604 begins a read cycle. Internal address bits on bus 870, corresponding to the external address on bus 608, are applied in parallel to each address table word A0–Am. A short time later, clock signal CLK1 goes high, leaving each lead match signal LMAT latched high by inverter 1808 and P-channel transistor 1806 (FIG. 18). If the address on bus 870 matches one of the address table words, for example word A0, then lead match signal LMAT on lead 836 remains high and 31 other lead match signals go low. The high level on lead 836 holds enable signal EN* on lead 860 low. Subsequently, clock signal /CLK2 on lead 1702 goes low, and OR gate 868 produces a low level inhibit signal /INH on lead 614. This low level inhibit signal /INH interrupts the FRAM read cycle prior to word and plate line selection as previously described. Thus, FRAM 604 does not produce a data word on data bus 610. The low level of enable signal EN* on lead 860 produces a low level enable signal on lead 804 that holds the address word line signal AWL low, thereby preventing any change to the address table words. The high levels of clock signal CLK on lead 1602 and lead match signal LMAT on lead 836 (FIG. 19) produce a low level on lead 904 and consequent high level data word line signal DWL on lead 910. The high level data word line signal DWL applied to data table word D0 842 (FIG. 15) produces a 32-bit data word on bus 610. An address match during a read cycle, therefore, interrupts the FRAM, thereby preventing memory access and fatigue to the nonvolatile ferroelectric memory cells. Rather, the volatile memory cell of the data table produces the 32-bit data word on bus 610.

If the address on bus 870 fails to match any of the address table words, then all 32 match signals go low. The low levels applied to NOR gate 838 produce a high level enable signal EN* on lead 836. Subsequently, clock signal /CLK2 on lead 1702 goes low, and OR gate 868 produces a high level inhibit signal /INH on lead 614 as determined by enable signal EN*. This high level inhibit signal /INH permits FRAM 604 to continue the read cycle and produce a data word on bus 610. The high level of enable signal EN* on lead 860 also produces a high level enable signal on lead 804 that activates the address word line signal AWL. The high level of the address word line signal AWL on lead 814 loads the corresponding address table word, for example A0, with the address on internal address bus 870. The high levels of address word line signal AWL on lead 814 and enable signal EN* on lead 860 produce a low level signal on lead 906 and a corresponding high level data word line signal DWL on lead 910 (FIG. 19). The high level data word line signal DWL applied to data table word D0 842 (FIG. 15) permits the FRAM output circuit 712 to overwrite the 32-bit data word D0 via bus 610. Failure to match an address during a read cycle, therefore, permits the nonvolatile FRAM to complete the read cycle, thereby producing a 32-bit data word on bus 610. The address of the data word is loaded into the CAM address table at a location indicated by the address table pointer 880. The data word on bus 610 is loaded into the corresponding data table word.

Synchronous Write Cycle

A write cycle is initiated when processor 600 produces an address on bus 608, a high level clock enable signal CKE on lead 1600, a high level clock signal CLK on lead 1602, and a low level read/write signal R/W on lead 612. The CAM 602 initially attempts to match the address on bus 608 with an address stored in the address table in the same manner as the read cycle. If no match is detected, all 32 lead match signals such as LMAT on lead 836 are driven low. This low level of all lead match input signals to NOR gate 838 produces a high level enable signal EN* on lead 860. When clock signal /CLK2 goes low, therefore, OR gate 868 continues to produce a high level inhibit signal /INH. The FRAM 604, however, ignores inhibit signal /INH during a write cycle and stores a 32-bit data word at an address on bus 608. The high level of enable signal EN* on lead 860 together with the high level of clock signal CLK produce a high level enable signal from AND gate 802. This high level enable signal on lead 804 enables the address table decoders. A selected address table decoder determined by the address table pointer, for example AND gate 808, produces a high level address word line signal AWL on lead 814, thereby loading the address on bus 870 into address word A0 820. Furthermore, the high level address word line signal AWL on lead 814 together with the high level enable signal EN* on lead 860 produce a high level data word line signal DWL on lead 910 (FIG. 19). This high level data word line signal DWL permits the 32-bit data word on bus 610 to overwrite the data word D0 842. The write cycle terminates when clock signals CLK and CLK1 go low. This precharges all lead match signals high and returns enable signal EN* to a low level. The high-to-low transition of enable signal EN* applied to NOR gate 854 produces a high level increment pulse /NC on lead 856. This pulse increments address table pointer 880 to point to the next address table location. Clock signal /CLK2 returns to a high level, thereby producing a high level /INH signal in preparation for the next memory access.

If an address match is detected during a write cycle, one of the 32 lead match signals such as LMAT on lead 836 remains high. This high level applied to NOR gate 838 produces a low level enable signal EN* on lead 860. When clock signal /CLK2 goes low, OR gate 868 produces a low level inhibit signal /INH. The FRAM 604 again ignores the inhibit signal /INH during a write cycle and stores a 32-bit data word at an address on bus 608. The low level of enable signal EN* on lead 860 together with the high level of clock signal CLK produce a low level enable signal from AND gate 802. This low level enable signal on lead 804 disables the address table decoders, thereby preventing any change to the address table words. The high level clock signal CLK1 on lead 1700 together with the high level lead match signal LMAT on lead 836 produces a high level data word line signal DWL on lead 910 (FIG. 19). This high level data word line signal DWL permits the 32-bit data word on bus 610 to overwrite the data word D0 842. The CAM address table, therefore, remains unchanged during a write cycle when an address match is detected. The data word corresponding to the matching address, however, is overwritten with the same data stored in the FRAM. The write cycle is terminated when clock signal CLK goes low, thereby disabling the address table decoders. A short time later, clock signal CLK1 goes low and precharges all lead match signals high. Since, enable signal EN* remains low, no increment pulse INC is generated on lead 856, and the address table pointer remains unchanged.

Figure 20:
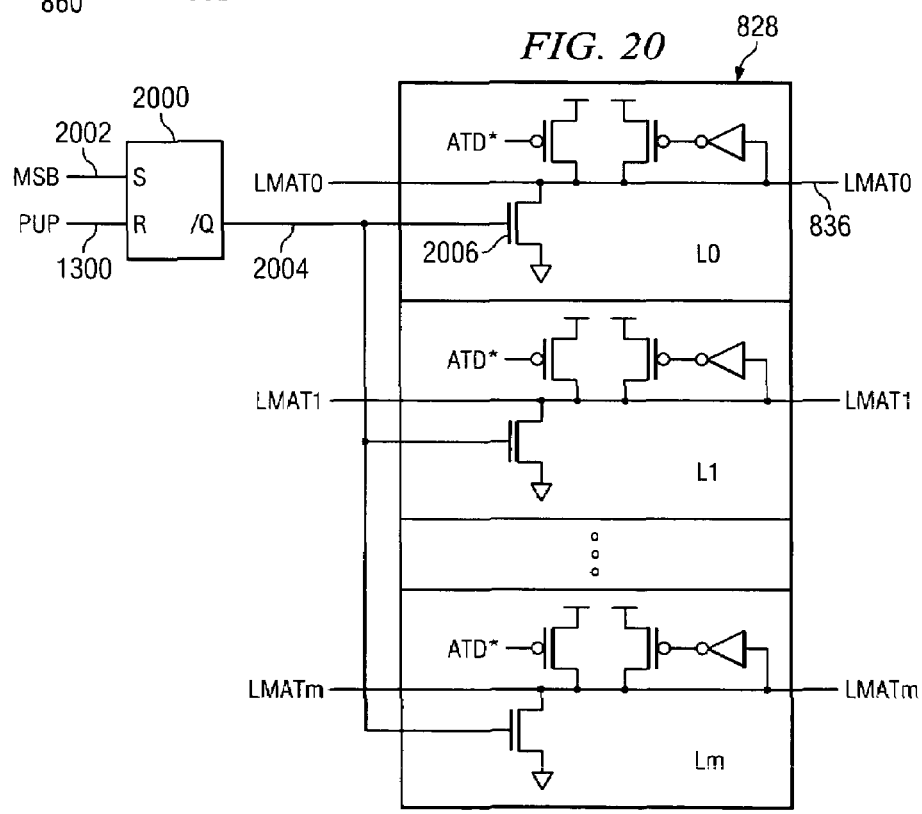
FIG. 20 is circuit diagram of another embodiment of the latch cell of the content addressable memory 602 of FIG. 6.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, address flag bits AF0–AFm are used to indicate invalid address words before the address table is filled. Referring to FIGS. 8 and 20, these address flag bits may be eliminated from the address table with the addition of an SR flip-flop 2000 if the address table is initially filled with nonredundant addresses. A most significant bit MSB is added to address table pointer 880 that does not participate in addressing. An N-channel transistor 2006 is included in each latch circuit L0–Lm. The gates of these N-channel transistors are coupled to the complementary output of SR flip-flop 2000 by lead 2004. Power up pulse PUP initially resets flip-flop 2000 so that the signal on lead 2004 is high. This high level causes each N-channel transistor such as 2006 to hold its respective lead match signal LMAT0–LMATm low. These low level lead match signals indicate a perpetual failure to match any external address on bus 608 to an address table entry. This perpetual mismatch continues until the entire address and data table are filled with addresses and corresponding data words. On the next read or write access, address table pointer 880 sets the most significant bit MSB and the 5 less significant bits roll over to an all zero condition. The most significant bit on lead 2002 sets flip-flop 2000 so that complementary output signal /Q is taken low. This low level on lead 2004 turns off all N-channel transistors 2006 and permits address matching, since all address and data table entries are now valid.

In view of the foregoing discussion, it is intended that the appended claims encompass any such modifications or embodiments.

What is claimed is:

1. A method of operating a memory circuit, comprising the steps of:
   storing a first data word at a first address in a nonvolatile memory circuit;
   storing the first address and the first data word in a volatile memory circuit;
   applying a first external address to the volatile memory circuit;
   comparing the first external address to the first address;
   producing the first data word from the volatile memory circuit on a data bus when the first external address matches the first address; and
   producing the first data word from the nonvolatile memory circuit on the data bus when the first external address does not match the first address.

2. A method as in claim 1, wherein the nonvolatile memory circuit is a ferroelectric memory circuit.

3. A method as in claim 1, comprising the step of detecting an invalid address in the volatile memory circuit.

4. A method as in claim 1, comprising the step of storing the first external address and the first data word in the volatile memory circuit when the first external address does not match the first address.

5. A method as in claim 1, comprising the steps of:
   pointing to an address in the volatile memory circuit with an address pointer;
   changing the address pointer when the first external address does not match the first address.

6. A method as in claim 1, comprising the steps of:
   applying a second external address to the volatile memory circuit and to the nonvolatile memory circuit;
   applying a second data word to the volatile memory circuit and to the nonvolatile memory circuit;
   comparing the second external address to the first address;
   not changing the first address in the volatile memory circuit when the second external address matches the first address;
   storing the second data word in the volatile memory circuit; and
   storing the second data word in the nonvolatile memory circuit at the second external address.

7. A method as in claim 1, comprising the stop of producing a control signal at the volatile memory circuit in response to the step of comparing, the control signal arranged to control data production by the nonvolatile memory circuit.

8. A method of operating a memory circuit, comprising the steps of:
   storing a first data word at a first address in a first memory circuit;

storing the first address and the first data word in a second memory circuit;

enabling the first and second memory circuits;

applying a first external address to the second memory circuit;

comparing the first external address to the first address;

disabling the first memory circuit in response to the step of comparing when the first external address matches the first address;

producing the first data word from the second memory circuit on a data bus when the first external address matches the first address; and producing the first data word from the first memory circuit on the data bus when the first external address does not match the first address.

9. A method as in claim 8, wherein the first memory circuit is a ferroelectric memory circuit.

10. A method as in claim 8, comprising the step of detecting an invalid address in the second memory circuit.

11. A method as in claim 8, comprising the step of storing the first external address and the first data word in the second memory circuit when the first external address does not match the first address.

12. A method as in claim 8, comprising the steps of:
pointing to an address in the second memory circuit with an address pointer;
changing the address pointer when the first external address does not match the first address.

13. A method as in claim 8, comprising the steps of:
applying a second external address to the first memory circuit and to the second memory circuit;
applying a second data word to the first memory circuit and to the second memory circuit;
comparing the second external address to the first address;
not changing the first address in the second memory circuit when the second external address matches the first address;
changing the first address to the second external address in the second memory circuit when the second external address does not match the first address;
storing the second data word in the second memory circuit; and
storing the second data word in the first memory circuit at the second external address.

14. A method as in claim 8, comprising the step of producing a control signal at the second memory circuit in response to the step of comparing, the control signal arranged to control data production by the first memory circuit.

15. A circuit, comprising:
an address table arranged to store a plurality of addresses and coupled to receive an external address;
an address table pointer coupled to the address table and arranged to address the address table;
a data table coupled to the address table and arranged to store a first plurality of data words, each data word corresponding to a respective address in the address table;
a nonvolatile memory circuit arranged to store a second plurality of data words greater than the first plurality; and
a data terminal coupled to the data table and to the nonvolatile memory circuit.

16. A memory circuit as in claim 15, wherein the nonvolatile memory circuit comprises a plurality of ferroelectric memory cells.

17. A memory circuit as in claim 15, wherein the address table comprises $2^N$ words and wherein the address table pointer includes more than N bits and wherein N is a positive integer.

18. A memory circuit as in claim 15, comprising a pulse generating circuit arranged change the address table pointer.

19. A computer system, comprising:
a processor circuit;
a nonvolatile memory circuit arranged to store a first data word at a first address;
a volatile memory circuit arranged to store the first data word and the first address;
an address table pointer coupled to an address table of the volatile memory circuit and arranged to address the address table;
a data bus coupled to the processor and the volatile and nonvolatile memory circuits; and
an address bus coupled to the processor and the volatile and nonvolatile memory circuits.

20. A computer system as in claim 19, wherein the nonvolatile memory circuit comprises a plurality of ferroelectric memory cells.

21. A computer system as in claim 19, wherein the nonvolatile and volatile memory circuits are coupled to receive a system clock signal from the processor.

22. A computer system as in claim 19, wherein the nonvolatile memory circuit is coupled to receive a control signal from the volatile memory circuit, the control signal arranged to control data production from the nonvolatile memory circuit.

* * * * *